United States Patent
Hung et al.

(10) Patent No.: US 8,035,417 B1
(45) Date of Patent: Oct. 11, 2011

(54) OUTPUT BUFFER CIRCUIT WITH VARIABLE DRIVE STRENGTH

(75) Inventors: Chun-Hsiung Hung, Hsinchu (TW); Chun-Yi Lee, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 12/843,452

(22) Filed: Jul. 26, 2010

(51) Int. Cl.
*H03K 19/094* (2006.01)

(52) U.S. Cl. ............... 326/86; 326/87; 326/58; 326/27

(58) Field of Classification Search .................. None
See application file for complete search history.

(56) References Cited

U.S. PATENT DOCUMENTS

| | | | | |
|---|---|---|---|---|
| 5,153,450 A | * | 10/1992 | Ruetz | 326/87 |
| 6,281,706 B1 | * | 8/2001 | Wert et al. | 326/83 |
| 2002/0093363 A1 | * | 7/2002 | Wey et al. | 326/87 |

* cited by examiner

*Primary Examiner* — Shawk Ismail
*Assistant Examiner* — Jany Tran
(74) *Attorney, Agent, or Firm* — Kenta Suzue; Haynes Beffel & Wolfeld LLP

(57) ABSTRACT

An output buffer circuit has a variable output drive strength, depending on a buffer enable signal. Multiple output buffer circuits have a variable combined output drive strength, depending on a set of buffer enable signals.

18 Claims, 8 Drawing Sheets

| Tri-State (Z=0, ZB=1) | | |
|---|---|---|
| Data | 0 | 1 |
| PU | 1 | 1 |
| PD | 0 | 0 |
| DQ | Float | Float |

| NonTri-State (Z=1, ZB=0) | | | | |
|---|---|---|---|---|
| Option ON/OFF | OPON=1 & OPONB=0 (ON) | | OPON=0 & OPONB=1 (OFF) | |
| Data | 0 | 1 | 0 | 1 |
| PU | 1 | 0 | 1 | Float |
| PD | 1 | 0 | Float | 0 |
| DQ | 0 | 1 | Float | Float |

Fig. 3

| Tri-State (Z=0, ZB=1) | | |
|---|---|---|
| Data | 0 | 1 |
| PU | 1 | 1 |
| PD | 0 | 0 |
| DQ | Float | Float |

| NonTri-State (Z=1, ZB=0) | | | | |
|---|---|---|---|---|
| Option ON/OFF | OPON=1 & OPONB=0 (ON) | | OPON=0 & OPONB=1 (OFF) | |
| Data | 0 | 1 | 0 | 1 |
| PU | 1 | 0 | 1 | Float |
| PD | 1 | 0 | Float | 0 |
| DQ | 0 | 1 | Float | Float |

Fig. 5

OUTPUT BUFFER CIRCUIT WITH VARIABLE DRIVE STRENGTH

BACKGROUND

1. Field of the Invention

This technology relates to an output buffer circuit.

2. Description of Related Art

Prior output buffer circuits are either on or off, forcing a "one size fits all" design for the output drive strength.

An alternative approach customizes each and every output buffer circuit, so that each and every output buffer circuit has an appropriate drive strength depending on its purpose and the subsequently coupled circuits. Yet this enormously complicates design.

SUMMARY

Various embodiments describe a buffer circuit.

First Apparatus Aspect with Multiple Output Buffer Circuits

One aspect is an apparatus with a plurality of output buffer circuits. The plurality of output buffer circuits is coupled in parallel to provide a combined output drive strength.

Each output buffer circuit includes the following.

A buffer data input (DATA input transistors in some embodiments) receives a data input signal shared across the plurality of output buffer circuits.

A first buffer enable input receives a first buffer enable signal (Z/ZB in some embodiments) shared across the plurality of output buffer circuits.

A second buffer enable input receiving a second buffer enable signal (OPON/OPONB in some embodiments) customized across the plurality of output buffer circuits.

A buffer data output (DQ output transistors in some embodiments) provides a data output signal having a drive strength. The data output signal is combined across the plurality of output buffer circuits to provide a combined data output signal having the combined output drive strength, and the combined output drive strength is tuned by the second buffer enable signals customized across the plurality of output buffer circuits.

In some embodiments, the data output signal (DQ in some embodiments) of each of the data output signals has a range of output values including logically high, logically low, and floating.

In some embodiments, the combined data output signal (combined DQ in some embodiments) has a range of output values including logically high, logically low, and floating. The logically high and logically low output values have the combined output drive strength tuned by the second buffer enable signals (OPON/OPONB in some embodiments) across the plurality of output buffer circuits.

In some embodiments, the plurality of output buffer circuits is configured to receive the data input signal being logically high (DATA=high in some embodiments) and the first buffer enable signal being an enable value (Z=high in some embodiments), and respond with the combined data output signal being logically high (combined DQ=high in some embodiments) and the combined output drive strength determined by a sum of the drive strengths across the plurality of output buffer circuits. The sum of the drive strengths excludes drive strengths of output buffer circuits in the plurality of output buffer circuits that receive the second buffer enable signal having a disable value (OPON=low in some embodiments).

In some embodiments, the plurality of output buffer circuits is configured to receive the data input signal being logically low (DATA=low in some embodiments) and the first buffer enable signal being an enable value (Z=high in some embodiments), and respond with the combined data output signal being logically low (combined DQ=low in some embodiments) and the combined output drive strength determined by a sum of the drive strengths across the plurality of output buffer circuits. The sum of the drive strengths excludes drive strengths of output buffer circuits in the plurality of output buffer circuits that receive the second buffer enable signal having a disable value (OPON=low in some embodiments).

In some embodiments, the plurality of output buffer circuits is configured to receive the first buffer enable signal having a disable value (Z=low in some embodiments), and respond with the plurality of output buffer circuits providing the combined data output signal having a floating value (combined DQ=float in some embodiments).

In some embodiments, each output buffer circuit of the plurality of output buffer circuits is configured to receive the second buffer enable signal having a disable value (OPON=low in some embodiments), and respond with the buffer data output providing the output signal having a floating value (DQ=float in some embodiments).

In some embodiments, the plurality of output buffer circuits receives a first plurality of second buffer enable signals ($1^{st}$ set of OPON[x:0] signals in some embodiments). The first plurality of second buffer enable signals includes the second buffer enable signal of each output buffer circuit of the plurality of output buffer circuits.

The apparatus includes a second plurality of output buffer circuits coupled in parallel to provide a second combined output drive strength. The second plurality of output buffer circuits receives a second plurality of second buffer enable signals ($2^{nd}$ set of OPON[x:0] signals in some embodiments) customized across the second plurality of output buffer circuits.

The first plurality of second buffer enable signals and the second plurality of second buffer enable signals have at least one different value. ($1^{st}$ set of OPON[x:0] signals and $2^{nd}$ set of OPON[x:0] signals have at least one different value in some embodiments)

In some embodiments, the first buffer enable signal (Z in some embodiments) is received together with a complement of the first buffer enable signal (ZB in some embodiments), and the first buffer enable signal controls a first pair of transistors having opposite conductivity types, and the complement of the first buffer enable signal controls a second pair of transistors having opposite conductivity types.

The second buffer enable signal (OPON in some embodiments) is received together with a complement of the second buffer enable signal (OPONB in some embodiments), and the second buffer enable signal and the complement of the second buffer enable signal control a third pair of transistors having opposite conductivity types.

In some embodiments, the buffer data output includes a first transistor and a second transistor having opposite conductivity types and coupled in series between different voltage references. (1st and 2nd transistors are DQ output transistors in some embodiments).

The buffer data input includes a third transistor and a fourth transistor having opposite conductivity types (3rd and 4th transistors are DATA input transistors in some embodiments). Gates of the third transistor and the fourth transistor receive the data input signal. First current carrying terminals of the third transistor and the fourth transistor are coupled to different voltage references. Second current carrying terminals of the third transistor and the fourth transistor are coupled to different gates of the first transistor and the second transistor.

The first buffer enable signal is received together with a complement of the first buffer enable signal (Z and ZB in some embodiments), and the first buffer enable signal received by gates of a fifth transistor and a sixth transistor coupled in series and having opposite conductivity types (5th and 6th transistors are Z input transistors in some embodiments), and the complement of the first buffer enable signal is received by gates of a seventh transistor and an eighth transistor coupled in series and having opposite conductivity types (7th and 8th transistors are ZB input transistors in some embodiments). A first intermediate node between the fifth and sixth transistors is coupled to the gate of the first transistor. A second intermediate node between the seventh and eighth transistors is coupled to the gate of the second transistor. Current carrying terminals of the fifth and seventh transistors are coupled to different voltage references.

The second buffer enable signal is received together with a complement of the second buffer enable signal (OPON and OPONB in some embodiments), and the second buffer enable signal and the complement of the second buffer enable signal are received by different gates of a ninth transistor and a tenth transistor having opposite conductivity types (9th and 10th transistors are OPON and OPONB input transistors in some embodiments), and the ninth transistor and the sixth transistor are coupled in series between the gates of the first and second transistors, and the tenth and the eighth transistor are coupled in series between the gates of the first and second transistors.

In some embodiments, the buffer data output includes a first transistor and a second transistor having opposite conductivity types (1st and 2nd transistors are DQ output transistors in some embodiments) and coupled in series between different voltage references.

The buffer data input includes a third transistor and a fourth transistor having opposite conductivity types (3rd and 4th transistors are DATA input transistors in some embodiments). Gates of the third transistor and the fourth transistor receive the data input signal. First current carrying terminals of the third transistor and the fourth transistor are coupled to different voltage references. Second current carrying terminals of the third transistor and the fourth transistor are coupled to different gates of the first transistor and the second transistor.

The first buffer enable signal is received together with a complement of the first buffer enable signal (Z and ZB in some embodiments), and the first buffer enable signal and the complement of the first buffer enable signal are received by different gates of a fifth transistor and a sixth transistor having opposite conductivity types (5th and 6th transistors are Z and ZB input transistors in some embodiments). First current carrying terminal of the fifth and sixth transistors are coupled to different voltage references. Second current carrying terminal of the fifth and sixth transistors are coupled to different gates of the first transistor and the second transistor.

The second buffer enable signal is received together with a complement of the second buffer enable signal (OPON and OPONB in some embodiments), and the second buffer enable signal and the complement of the second buffer enable signal are received by different gates of a seventh transistor and an eighth transistor having opposite conductivity types (7th and 8th transistors are OPON and OPONB input transistors in some embodiments). The seventh transistor and the eighth transistor are coupled in parallel between the gates of the first and second transistors.

Second Apparatus Aspect with Multiple Output Buffer Circuits

One aspect is an apparatus with a plurality of output buffer circuits. The plurality of output buffer circuits is coupled in parallel to provide a combined output drive strength. Each output buffer circuit of the plurality of output buffer circuits includes a buffer data output (DQ output transistors in some embodiments) providing a data output signal having a drive strength.

The data output signal is combined across the plurality of output buffer circuits to provide a combined data output signal having the combined output drive strength. The combined output drive strength is tuned by buffer enable signals (OPON/OPONB in some embodiments) customized across the plurality of output buffer circuits.

In some embodiments, the data output signal of each of the data output signals (DQ in some embodiments) has a range of output values including logically high, logically low, and floating.

In some embodiments, the combined data output signal (combined DQ in some embodiments) has a range of output values including logically high, logically low, and floating. The logically high and logically low output values have the combined output drive strength tuned by the buffer enable signals (OPON/OPONB in some embodiments) across the plurality of output buffer circuits.

In some embodiments, the plurality of output buffer circuits is configured to receive a data input signal being logically high (DATA=high in some embodiments), and respond with the combined data output signal being logically high (combined DQ=high in some embodiments) and the combined output drive strength determined by a sum of drive strengths across the plurality of output buffer circuits. The sum of drive strengths excludes drive strengths of output buffer circuits in the plurality of output buffer circuits that receive the buffer enable signal having a disable value (OPON=low in some embodiments).

In some embodiments, the plurality of output buffer circuits is configured to receive the data input signal being logically low (DATA=low in some embodiments), and respond with the combined data output signal being logically low (combined DQ=low in some embodiments) and the combined output drive strength determined by a sum of drive strengths across the plurality of output buffer circuits, The sum of drive strengths excludes drive strengths of output buffer circuits in the plurality of output buffer circuits that receive the buffer enable signal having a disable value (OPON=low in some embodiments).

In some embodiments, each output buffer circuit of the plurality of output buffer circuits is configured to receive the buffer enable signal having a disable value (OPON=low in some embodiments), and provide an output signal having a floating value (DQ=float in some embodiments).

In some embodiments, the plurality of output buffer circuits receives a first plurality of buffer enable signals ($1^{st}$ set of OPON[x:0] signals in some embodiments), the first plurality of buffer enable signals including the buffer enable signal of each output buffer circuit of the plurality of output buffer circuits.

The apparatus includes a second plurality of output buffer circuits coupled in parallel to provide a second combined output drive strength, and the second plurality of output buffer circuits receives a second plurality of buffer enable signals ($2^{nd}$ set of OPON[x:0] signals in some embodiments) customized across the second plurality of output buffer circuits.

The first plurality of buffer enable signals and the second plurality of buffer enable signals have at least one different value. (1st set of OPON[x:0] signals and 2nd set of OPON[x:0] signals have at least one different value in some embodiments)

In some embodiments, the buffer enable signals (OPON in some embodiments) are received together with complements of the buffer enable signals (OPONB in some embodiments), and the buffer enable signals and the complements of the buffer enable signals control pairs of transistors having opposite conductivity types.

Third Apparatus Aspect with Output Buffer Circuit

One aspect is an apparatus with an output buffer circuit. The output buffer circuit includes the following.

A buffer data input (DATA input transistors in some embodiments) receives a data input signal shared with other output buffer circuits.

A first buffer enable input receives a first buffer enable signal (Z/ZB in some embodiments) shared with other output buffer circuits.

A second buffer enable input receives a second buffer enable signal (OPON/OPONB in some embodiments) customized to the output buffer circuit.

A buffer data output (DQ output transistors in some embodiments) provides a data output signal.

BRIEF DESCRIPTION OF THE DRAWINGS

FIG. 3 is a set of truth tables that show the operation of the circuit of FIG. 2, in both tri-state mode and non tri-state mode.

FIG. 5 is a set of truth tables that show the operation of the circuit of FIG. 4, in both tri-state mode and non tri-state mode.

DETAILED DESCRIPTION

In this document, the phrase enable or disable indicates whether, in response to a signal, a particular circuit is active or inactive. Various embodiments process a signal with p-type or n-type field effect transistors, such that whether a particular signal is an enable signal or disable signal not determined by whether the signal is high or low, but rather whether the particular circuit is inactive or active responsive to the signal.

An output buffer sets a voltage on an output line to drive a load. For different applications, for example VCC=1.8V and VCC=3.0V, the requirements of driver capability are also different. For example, under conditions of the same load and output speed, VCC=1.8V needs a larger driver size compared to VCC=3.0V. Unsuitable driver capability causes slow output speed or power noise.

Figure 1:
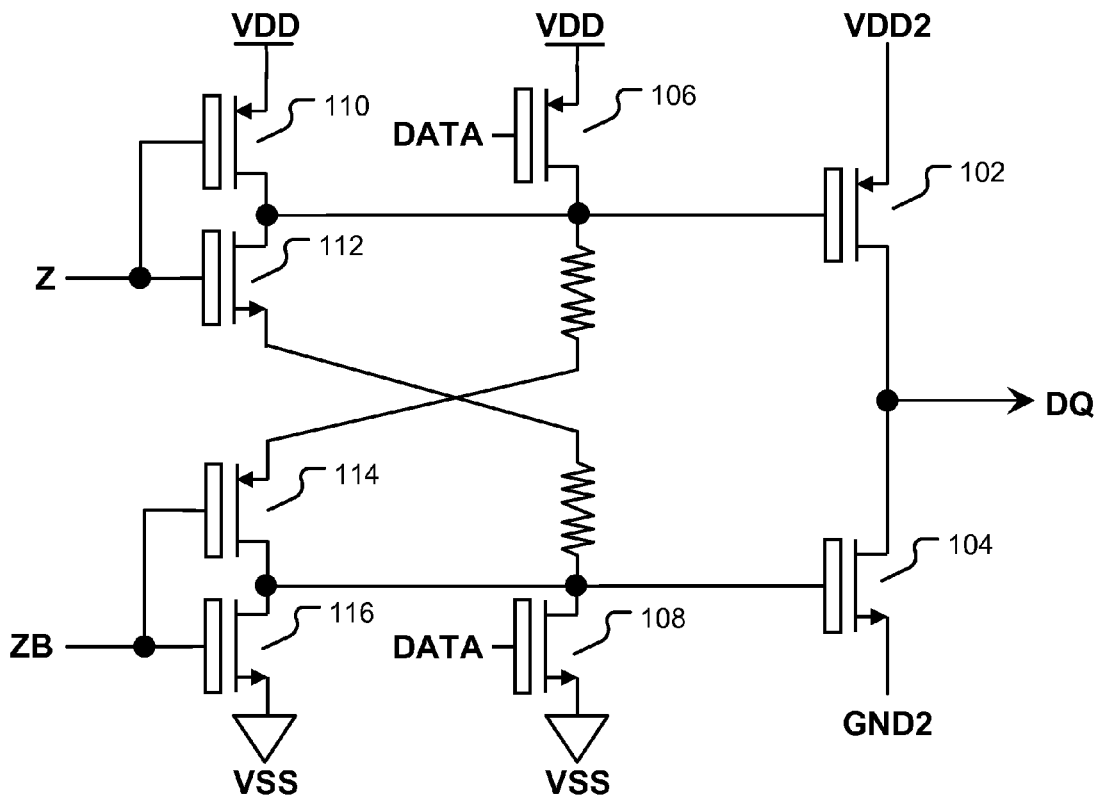
FIG. 1 is a circuit diagram of an output buffer circuit, with a tri-state control input (Z and ZB).

FIG. 1 is a circuit diagram of an output buffer circuit, with a tri-state control input (Z and ZB).

The buffer data output includes a first transistor 102 (p-type) and a second transistor 104 (n-type) coupled in series between voltage references VDD2 and GND2. The 1st and 2nd transistors 102 and 104 are DQ output transistors in some embodiments.

The buffer data input includes a third transistor 106 (p-type) and a fourth transistor 108 (n-type). The 3rd and 4th transistors 106 and 108 are DATA input transistors in some embodiments. Gates of the third transistor and the fourth transistor 106 and 108 receive the data input signal DATA. First current carrying terminals of the third transistor 106 and the fourth transistor 108 are coupled to different voltage references, respectively VDD and VSS. Second current carrying terminals of the third transistor 106 and the fourth transistor 108 are coupled to different gates of the first transistor 102 and the second transistor 104.

The first buffer enable signal is received together with a complement of the first buffer enable signal (Z and ZB in some embodiments). The first buffer enable signal received by gates of a fifth transistor 110 (p-type) and a sixth transistor 112 (n-type) coupled in series. The 5th and 6th transistors 110 and 112 are Z input transistors in some embodiments. The complement of the first buffer enable signal is received by gates of a seventh transistor 116 (n-type) and an eighth transistor 114 (p-type) coupled in series. The 7th and 8th transistors are ZB input transistors in some embodiments. A first intermediate node between the fifth and sixth transistors 110 and 112 is coupled to the gate of the first transistor 102. A second intermediate node between the seventh and eighth transistors 116 and 114 is coupled to the gate of the second transistor 104. Current carrying terminals of the fifth and seventh transistors 110 and 116 are coupled to different voltage references, VDD and VSS.

Current carrying terminals of the sixth and eighth transistors 112 and 114 are coupled via some resistance to different gates of the first transistor 102 and the second transistor 104. The resistance is shown as discrete in the illustration. In various embodiments, the resistance is discrete for purposes of illustration, but is integrated.

Figure 2:
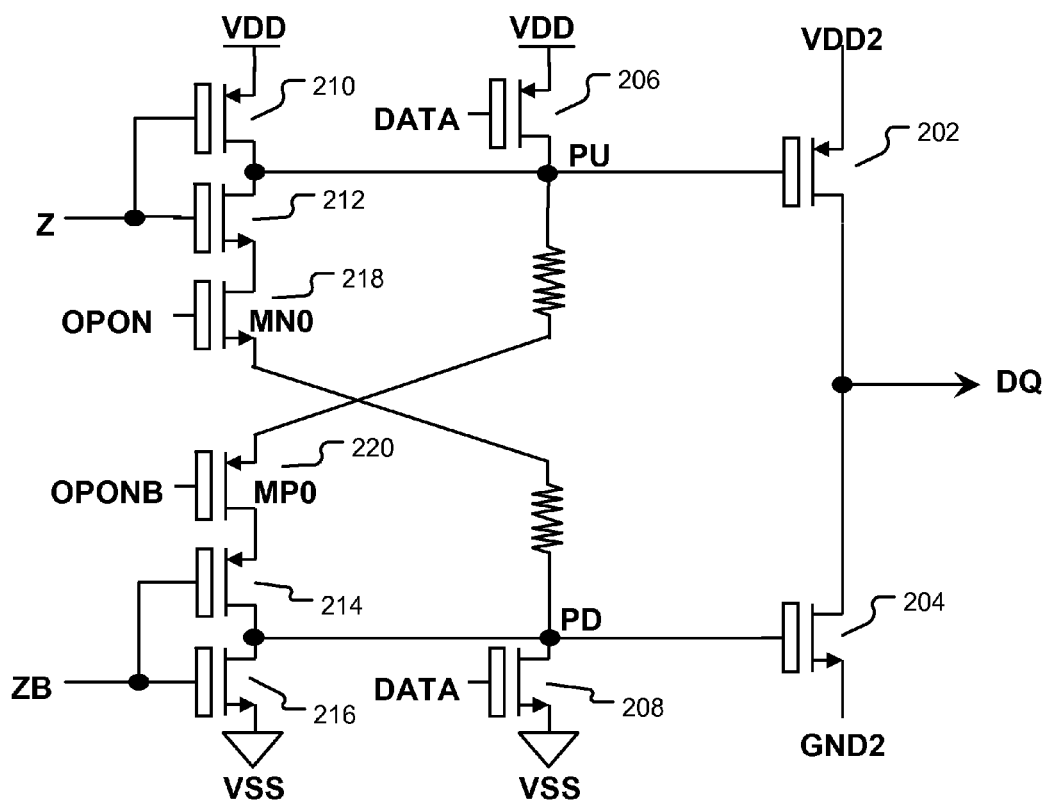
FIG. 2 is a circuit diagram of an output buffer circuit, with a tri-state control input (Z and ZB), and another input (OPON/OPONB).

FIG. 2 is a circuit diagram of an output buffer circuit, with a tri-state control input (Z and ZB), and another input (OPON/OPONB).

Relative to FIG. 1, the circuit diagram of FIG. 2 adds another enable signal and its complement.

The buffer data output includes a first transistor 202 (p-type) and a second transistor 204 (n-type) coupled in series between voltage references VDD2 and GND2. The 1st and 2nd transistors 202 and 204 are DQ output transistors in some embodiments.

The buffer data input includes a third transistor 206 (p-type) and a fourth transistor 208 (n-type). The 3rd and 4th transistors 206 and 208 are DATA input transistors in some embodiments. Gates of the third transistor and the fourth transistor 206 and 208 receive the data input signal DATA. First current carrying terminals of the third transistor 206 and the fourth transistor 208 are coupled to different voltage references, respectively VDD and VSS. Second current carrying terminals of the third transistor 206 and the fourth transistor 208 are coupled to different gates of the first transistor 202 and the second transistor 204.

The first buffer enable signal is received together with a complement of the first buffer enable signal (Z and ZB in some embodiments). The first buffer enable signal received by gates of a fifth transistor 210 (p-type) and a sixth transistor 212 (n-type) coupled in series. The 5th and 6th transistors 210 and 212 are Z input transistors in some embodiments. The complement of the first buffer enable signal is received by gates of a seventh transistor 216 (n-type) and an eighth transistor 214 (p-type) coupled in series. The 7th and 8th transistors are ZB input transistors in some embodiments. A first intermediate node between the fifth and sixth transistors 210 and 212 is coupled to the gate of the first transistor 202. A second intermediate node between the seventh and eighth transistors 216 and 214 is coupled to the gate of the second transistor 204. Current carrying terminals of the fifth and seventh transistors 110 and 116 are coupled to different voltage references, VDD and VSS.

The second buffer enable signal is received together with a complement of the second buffer enable signal (OPON and OPONB in some embodiments). The second buffer enable signal and the complement of the second buffer enable signal are received by different gates of a ninth transistor 218 (n-type) and a tenth transistor 220 (p-type). The 9th and 10th transistors are OPON and OPONB input transistors in some embodiments. The ninth transistor 218 and the sixth transistor 212 are coupled in series between the gates of the first and second transistors 202 and 204, with some intermediate resistance. The resistance is shown as discrete in the illustration. In various embodiments, the resistance is discrete for purposes of illustration, but is integrated.

The tenth and the eighth transistors 220 and 214 are coupled in series between the gates of the first and second transistors, with some intermediate resistance. The resistance is shown as discrete in the illustration. In various embodiments, the resistance is discrete for purposes of illustration, but is integrated.

FIG. 3 is a set of truth tables that show the operation of the circuit of FIG. 2, in both tri-state mode and non tri-state mode.

The first table shows tri-state mode, where the Z and ZB signals have a disable value. The output DQ is floating.

The second table shows non tri-state mode, where the Z and ZB signals have an enable value. The left part of the second table shows the OPON and OPONB signals with an enable value. The right part of the second table shows the OPON and OPONB signals with a disable value. When the OPON and OPONB signals have a disable value, the output DQ is floating. When the OPON and OPONB signals have an enable value, the output DQ is equal to the DATA input value.

Figure 4:
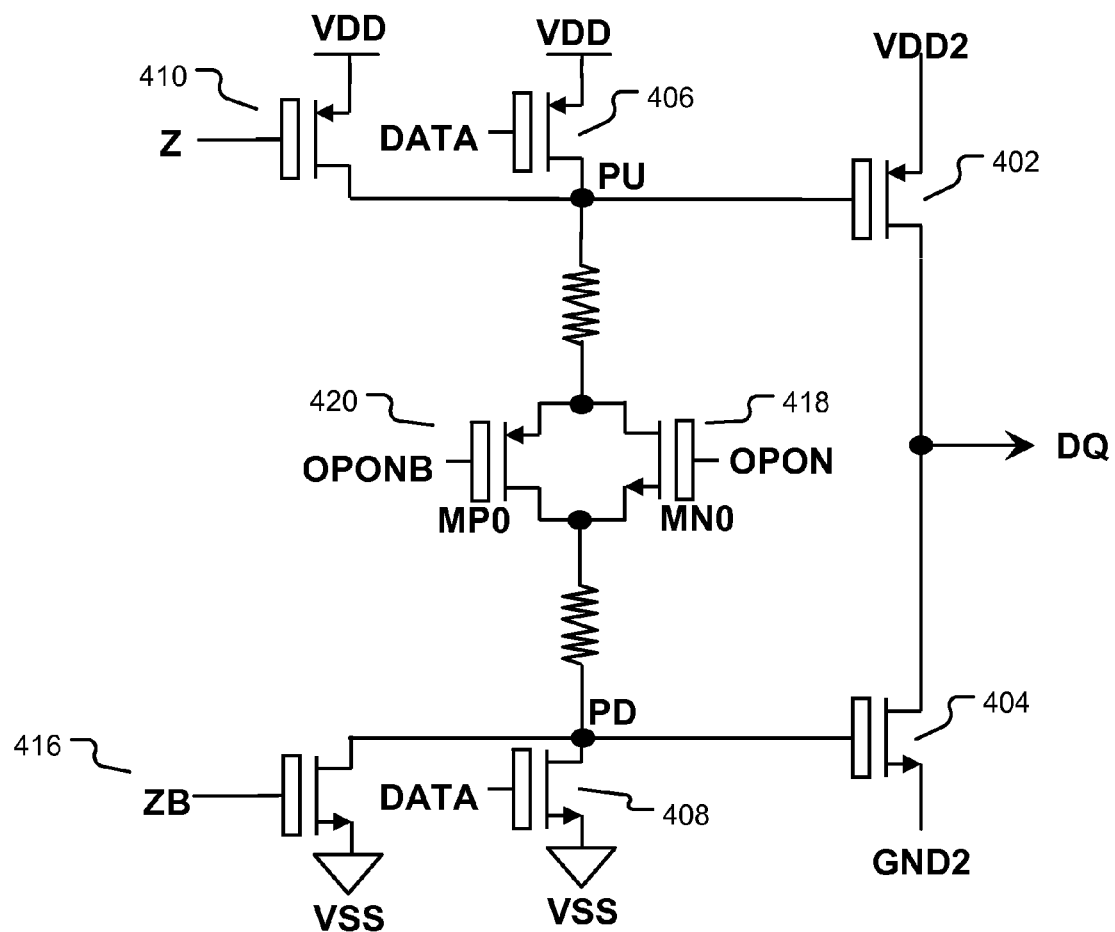
FIG. 4 is a circuit diagram of another output buffer circuit, with a tri-state control input (Z and ZB), and another input (OPON/OPONB).

FIG. 4 is a circuit diagram of another output buffer circuit, with a tri-state control input (Z and ZB), and another input (OPON/OPONB).

The buffer data output includes a first transistor 402 (p-type) and a second transistor 404 (n-type). The 1st and 2nd transistors 402 and 404 are DQ output transistors in some embodiments. The 1st and 2nd transistors 402 and 404 are coupled in series between different voltage references VDD2 and GND2.

The buffer data input includes a third transistor 406 (p-type) and a fourth transistor 408 (n-type). The 3rd and 4th transistors 406 and 4080 are DATA input transistors in some embodiments. Gates of the third transistor 406 and the fourth transistor 408 receive the data input signal. First current carrying terminals of the third transistor 406 and the fourth transistor 408 are coupled to different voltage references VDD and VSS. Second current carrying terminals of the third transistor 406 and the fourth transistor 408 are coupled to different gates of the first transistor 402 and the second transistor 404.

The first buffer enable signal is received together with a complement of the first buffer enable signal (Z and ZB in some embodiments). The first buffer enable signal and the complement of the first buffer enable signal are received by different gates of a fifth transistor 410 (p-type) and a sixth transistor 416 (n-type). The 5th and 6th transistors 410 and 416 are Z and ZB input transistors in some embodiments. First current carrying terminals of the fifth and sixth transistors 410 and 416 are coupled to different voltage references VDD and VSS. Second current carrying terminal of the fifth and sixth transistors 410 and 416 are coupled to different gates of the first transistor 402 and the second transistor 404.

The second buffer enable signal is received together with a complement of the second buffer enable signal (OPON and OPONB in some embodiments). The second buffer enable signal and the complement of the second buffer enable signal are received by different gates of a seventh transistor 418 (n-type) and an eighth transistor 420 (p-type). The 7th and 8th transistors 418 and 420 are OPON and OPONB input transistors in some embodiments. The seventh transistor 418 and the eighth transistor 420 are coupled in parallel between the gates of the first and second transistors 402 and 404 with some intermediate resistance. The resistance is shown as discrete in the illustration. In various embodiments, the resistance is discrete for purposes of illustration, but is integrated.

FIG. 5 is a set of truth tables that show the operation of the circuit of FIG. 4, in both tri-state mode and non tri-state mode.

The first table shows tri-state mode, where the Z and ZB signals have a disable value. The output DQ is floating.

The second table shows non tri-state mode, where the Z and ZB signals have an enable value. The left part of the second table shows the OPON and OPONB signals with an enable value. The right part of the second table shows the OPON and OPONB signals with a disable value. When the OPON and OPONB signals have a disable value, the output DQ is floating. When the OPON and OPONB signals have an enable value, the output DQ is equal to the DATA input value.

Figure 6:
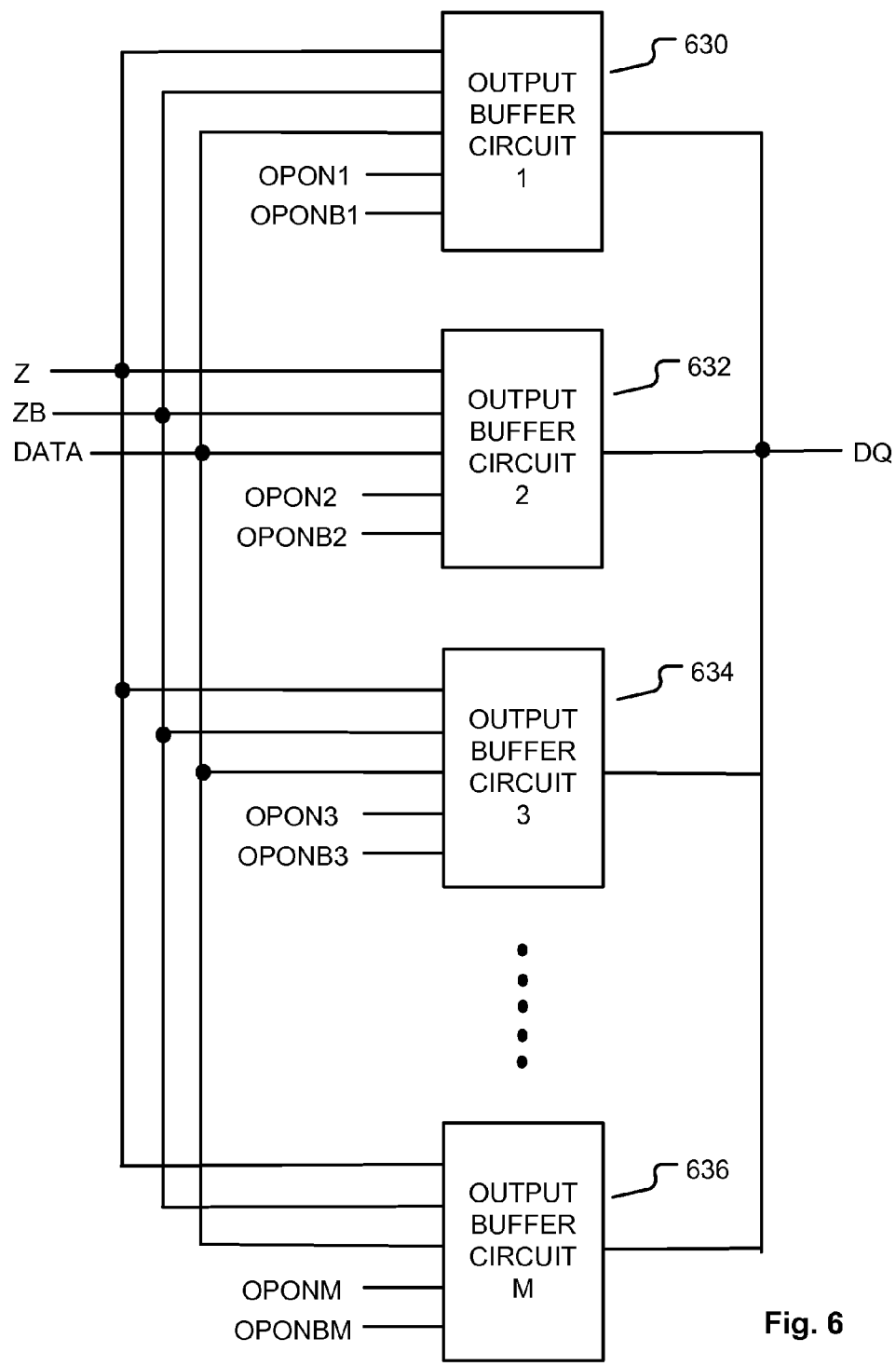
FIG. 6 is a block diagram of multiple output buffer circuits (such as FIG. 2 or 4) with a combined output drive strength that varies with the values of the control input signals (OPON[1:M]/OPONB[1:M]).

FIG. 6 is a block diagram of multiple output buffer circuits (such as FIG. 2 or 4) with a combined output drive strength that varies with the values of the control input signals (OPON[1:M]/OPONB[1:M]).

There are multiple output buffer circuits including output buffer circuit 1 630, output buffer circuit 2 632, output buffer circuit 3 634, up to output buffer circuit M 636. The output buffer circuits share common inputs Z, ZB, and DATA. The inputs OPON1 and OPONB1 to output buffer circuit 1 630, inputs OPON2 and OPONB2 to output buffer circuit 2 632, inputs OPON3 and OPONB3 to output buffer circuit 3 634, up to inputs OPONM and OPONBM to output buffer circuit M 636, are customized such that an adequate number of the output buffer circuits are enabled, and the remainder disabled. The enabled output buffer circuits combine their drive strengths, such that the shared output signal DQ across the multiple output buffer circuits has a combined output drive strength equal to the sum of the drive strengths of the enabled output buffer circuits. Accordingly, a circuit has a suitable driver size to fit the speed requirement, loading requirement, and reduce the power noise. The number M of the output buffer circuits ranges usefully from 2 up to any integer.

Figure 7:
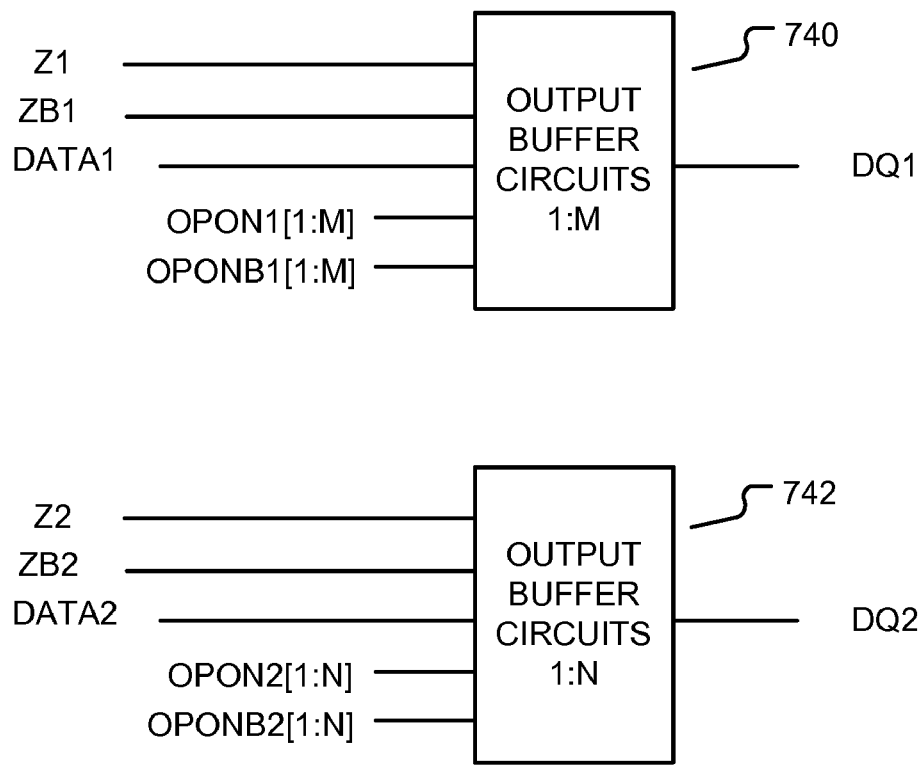
FIG. 7 is a block diagram of different groups of multiple output buffer circuits (such as FIG. 6) with different sets control input signals (OPON[1:M]/OPON2[1:N]) that may or may not be equal.

FIG. 7 is a block diagram of different groups of multiple output buffer circuits (such as FIG. 6) with different sets control input signals (OPON[1:M]/OPON2[1:N]) that may or may not be equal.

Two output buffers 740 and 742 are shown, each of which is, for example, the multiple output buffer circuit arrangement of FIG. 6. The sets of signals OPON1[1:M] and OPONB1[1:M] for the output buffer 740, and the sets of signals OPON2[1:N] and OPONB2[1:N] for the output buffer 742 may be unequal or equal. Each output buffer circuit can be fine tuned according to its distinct requirements.

Figure 8:
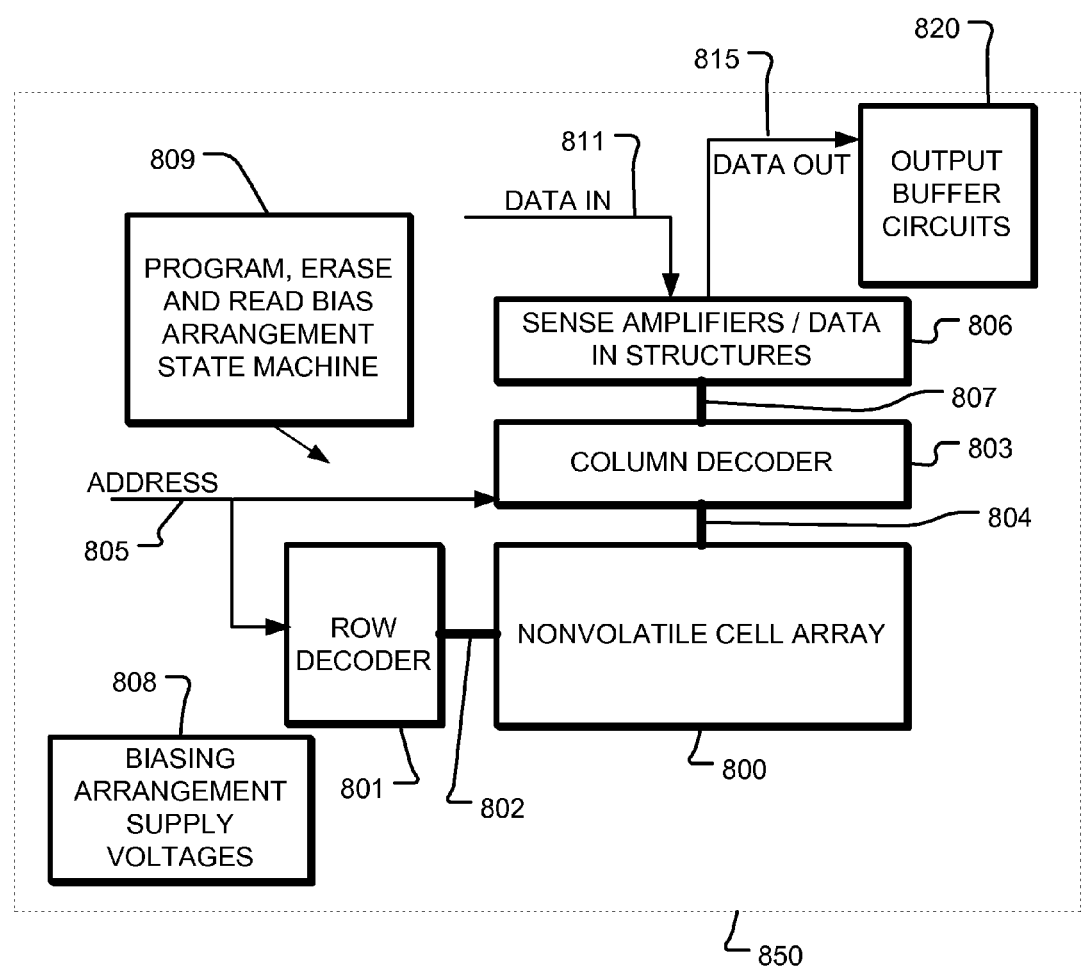
FIG. 8 is a block diagram of an example memory integrated circuit with the improved output buffer circuit.

FIG. 8 is a block diagram of an example memory integrated circuit with the improved output buffer circuit.

An integrated circuit 850 includes a memory array 800. A word line (or row) and block select decoder 801 is coupled to, and in electrical communication with, a plurality 802 of word lines and string select lines, and arranged along rows in the memory array 800. A bit line (column) decoder and drivers 803 are coupled to and in electrical communication with a plurality of bit lines 804 arranged along columns in the memory array 800 for reading data from, and writing data to, the memory cells in the memory array 800. Addresses are supplied on bus 805 to the word line decoder and drivers 801 and to the bit line decoder 803. Sense amplifiers and data-in structures in block 806, including current sources for the read, program and erase modes, are coupled to the bit line decoder 803 via the bus 807. Data is supplied via the data-in line 811 from input/output ports on the integrated circuit 850, to the data-in structures in block 806. Data is supplied via the data-out line 815 from the sense amplifiers in block 806 to input/output ports on the integrated circuit 850 via output buffer circuits 820, or to other data destinations internal or external to the integrated circuit 850.

In other embodiments, the signal is not an independently sent and received electrical signal, but fuse information, or triggered by self-calibration.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An apparatus, comprising:
   a plurality of output buffer circuits coupled in parallel to provide a combined output drive strength, each output buffer circuit of the plurality of output buffer circuits including:
     a buffer data input receiving a data input signal shared across the plurality of output buffer circuits;
     a first buffer enable input receiving a first buffer enable signal shared across the plurality of output buffer circuits;
     a second buffer enable input receiving a second buffer enable signal customized across the plurality of output buffer circuits;
     a buffer data output providing a data output signal having a drive strength,
   wherein the data output signal is combined across the plurality of output buffer circuits to provide a combined data output signal having the combined output drive strength, and the combined output drive strength is tuned by the second buffer enable signals customized across the plurality of output buffer circuits,
   wherein buffer enable signals are received together with complements of the buffer enable signals, and the buffer enable signals and the complements of the buffer enable signals control pairs of transistors having opposite conductivity types, and the buffer enable signals include the first buffer enable signal and the second buffer enable signal.

2. The apparatus of claim 1, wherein the data output signal of each of the data output signals has a range of output values including logically high, logically low, and floating.

3. The apparatus of claim 1, wherein the combined data output signal has a range of output values including logically high, logically low, and floating, wherein the logically high and logically low output values have the combined output drive strength tuned by the second buffer enable signals across the plurality of output buffer circuits.

4. The apparatus of claim 1, wherein the plurality of output buffer circuits is configured to receive the data input signal being logically high and the first buffer enable signal being an enable value, and respond with the combined data output signal being logically high and the combined output drive strength determined by a sum of the drive strengths across the plurality of output buffer circuits, the sum excluding drive strengths of output buffer circuits in the plurality of output buffer circuits that receive the second buffer enable signal having a disable value.

5. The apparatus of claim 1, wherein the plurality of output buffer circuits is configured to receive the data input signal being logically low and the first buffer enable signal being an enable value, and respond with the combined data output signal being logically low and the combined output drive strength determined by a sum of the drive strengths across the plurality of output buffer circuits, the sum excluding drive strengths of output buffer circuits in the plurality of output buffer circuits that receive the second buffer enable signal having a disable value.

6. The apparatus of claim 1, wherein the plurality of output buffer circuits is configured to receive the first buffer enable signal having a disable value, and respond with the plurality of output buffer circuits providing the combined data output signal having a floating value.

7. The apparatus of claim 1, wherein, each output buffer circuit of the plurality of output buffer circuits is configured to receive the second buffer enable signal having a disable value, and respond with the buffer data output providing the output signal having a floating value.

8. The apparatus of claim 1, wherein, the plurality of output buffer circuits receives a first plurality of second buffer enable signals, the first plurality of second buffer enable signals including the second buffer enable signal of each output buffer circuit of the plurality of output buffer circuits, and
   the apparatus includes a second plurality of output buffer circuits coupled in parallel to provide a second combined output drive strength, and the second plurality of output buffer circuits receives a second plurality of second buffer enable signals customized across the second plurality of output buffer circuits, and
   the first plurality of second buffer enable signals and the second plurality of second buffer enable signals have at least one different value.

9. The apparatus of claim 1,
   wherein the buffer data output includes a first transistor and a second transistor having opposite conductivity types and coupled in series between different voltage references,
   wherein the buffer data input includes a third transistor and a fourth transistor having opposite conductivity types, gates of the third transistor and the fourth transistor receiving the data input signal, first current carrying terminals of the third transistor and the fourth transistor coupled to different voltage references, second current carrying terminals of the third transistor and the fourth transistor coupled to different gates of the first transistor and the second transistor,
   wherein the first buffer enable signal is received together with a complement of the first buffer enable signal, and the first buffer enable signal received by gates of a fifth transistor and a sixth transistor coupled in series and having opposite conductivity types, and the complement of the first buffer enable signal is received by gates of a seventh transistor and an eighth transistor coupled in series and having opposite conductivity types, a first intermediate node between the fifth and sixth transistors is coupled to the gate of the first transistor, a second intermediate node between the seventh and eighth transistors is coupled to the gate of the second transistor, and current carrying terminals of the fifth and seventh transistors are coupled to different voltage references, wherein the second buffer enable signal is received together with a complement of the second buffer enable signal, and the second buffer enable signal and the complement of the second buffer enable signal are received by different gates of a ninth transistor and a tenth transistor having opposite conductivity types, and the ninth transistor and the sixth transistor are coupled in series between the gates of the first and second transistors, and the tenth and the eighth transistor are coupled in series between the gates of the first and second transistors.

10. The apparatus of claim 1, wherein the buffer data output includes a first transistor and a second transistor having opposite conductivity types and coupled in series between different voltage references, wherein the buffer data input includes a third transistor and a fourth transistor having opposite conductivity types, gates of the third transistor and the fourth transistor receiving the data input signal, first current carrying terminals of the third transistor and the fourth transistor coupled to different voltage references, second current carrying terminals of the third transistor and the fourth transistor coupled to different gates of the first transistor and the second transistor, wherein the first buffer enable signal is received together with a complement of the first buffer enable signal, and the first buffer enable signal and the complement of the first buffer enable signal are received by different gates of a fifth transistor and a sixth transistor having opposite conductivity types, first current carrying terminals of the fifth and sixth transistors are coupled to different voltage references, and second current carrying terminals of the fifth and sixth transistors are coupled to different gates of the first transistor and the second transistor, wherein the second buffer enable signal is received together with a complement of the second buffer enable signal, and the second buffer enable signal and the complement of the second buffer enable signal are received by different gates of a seventh transistor and an eighth transistor having opposite conductivity types, and the seventh transistor and the eighth transistor are coupled in parallel between the gates of the first and second transistors.

11. An apparatus, comprising:

a plurality of output buffer circuits coupled in parallel to provide a combined output drive strength, each output buffer circuit of the plurality of output buffer circuits including a buffer data output providing a data output signal having a drive strength, wherein the data output signal is combined across the plurality of output buffer circuits to provide a combined data output signal having the combined output drive strength, and the combined output drive strength is tuned by buffer enable signals customized across the plurality of output buffer circuits, wherein the buffer enable signals are received together with complements of the buffer enable signals, and the buffer enable signals and the complements of the buffer enable signals control pairs of transistors having opposite conductivity types.

12. The apparatus of claim 11, wherein the data output signal of each of the data output signals has a range of output values including logically high, logically low, and floating.

13. The apparatus of claim 11, wherein the combined data output signal has a range of output values including logically high, logically low, and floating, wherein the logically high and logically low output values have the combined output drive strength tuned by the buffer enable signals across the plurality of output buffer circuits.

14. The apparatus of claim 11, wherein the plurality of output buffer circuits is configured to receive a data input signal being logically high, and respond with the combined data output signal being logically high and the combined output drive strength determined by a sum of drive strengths across the plurality of output buffer circuits, the sum excluding drive strengths of output buffer circuits in the plurality of output buffer circuits that receive the buffer enable signal having a disable value.

15. The apparatus of claim 11, wherein the plurality of output buffer circuits is configured to receive the data input signal being logically low, and respond with the combined data output signal being logically low and the combined output drive strength determined by a sum of drive strengths across the plurality of output buffer circuits, the sum excluding drive strengths of output buffer circuits in the plurality of output buffer circuits that receive the buffer enable signal having a disable value.

16. The apparatus of claim 11, wherein, each output buffer circuit of the plurality of output buffer circuits is configured to receive the buffer enable signal having a disable value, and provide an output signal having a floating value.

17. The apparatus of claim 11, wherein, the plurality of output buffer circuits receives a first plurality of buffer enable signals, the first plurality of buffer enable signals including the buffer enable signal of each output buffer circuit of the plurality of output buffer circuits, and the apparatus includes a second plurality of output buffer circuits coupled in parallel to provide a second combined output drive strength, and the second plurality of output buffer circuits receives a second plurality of buffer enable signals customized across the second plurality of output buffer circuits, and the first plurality of buffer enable signals and the second plurality of buffer enable signals have at least one different value.

18. An apparatus, comprising:

an output buffer circuit including:
a buffer data input receiving a data input signal shared with other output buffer circuits;
a first buffer enable input receiving a first buffer enable signal shared with other output buffer circuits;
a second buffer enable input receiving a second buffer enable signal customized to the output buffer circuit; and
a buffer data output providing a data output signal,
wherein buffer enable signals are received together with complements of the buffer enable signals, and the buffer enable signals and the complements of the buffer enable signals control pairs of transistors having opposite conductivity types, and the buffer enable signals include the first buffer enable signal and the second buffer enable signal.

* * * * *